US006396760B1

(12) United States Patent
Behera et al.

(10) Patent No.: US 6,396,760 B1
(45) Date of Patent: May 28, 2002

(54) MEMORY HAVING A REDUNDANCY SCHEME TO ALLOW ONE FUSE TO BLOW PER FAULTY MEMORY COLUMN

(75) Inventors: Niranjan Behera, Santa Clara; Shreekanth K. Sampigethaya, San Jose, both of CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 09/810,817

(22) Filed: Mar. 16, 2001

(51) Int. Cl.[7] .................................. G11C 7/00
(52) U.S. Cl. .................. 365/225.7; 365/230.03
(58) Field of Search ........... 365/189.01, 230.03, 365/230.04, 225.7

(56) References Cited

U.S. PATENT DOCUMENTS 5,583,463 A * 12/1996 Merritt .................. 365/189.01
5,608,678 A   3/1997 Lysinger
5,859,801 A   1/1999 Poechmueller
6,084,819 A   7/2000 Kablanian
6,091,620 A   7/2000 Kablanian
6,104,663 A   8/2000 Kablanian

OTHER PUBLICATIONS

Betty Prince, Semiconductor Memories, copyright 1983, pp. 150–303.

* cited by examiner

Primary Examiner—Terrell W. Fears
(74) Attorney, Agent, or Firm—Blakely, Sokoloff, Taylor & Zafman LLP

(57) ABSTRACT

An apparatus and method in which a single fuse is asserted in a memory bank having a redundancy memory column structure. The assertion of the single fuse causes two or more of the input-output circuits to shift away from a primary memory column to a substitute memory column.

30 Claims, 7 Drawing Sheets

MEMORY HAVING A REDUNDANCY SCHEME TO ALLOW ONE FUSE TO BLOW PER FAULTY MEMORY COLUMN

FIELD OF THE INVENTION

The present invention relates generally to integrated circuit memory devices, and more specifically to an embedded memory having a column redundancy scheme.

BACKGROUND OF THE INVENTION

Random defects occurring during the manufacturing process of an integrated circuit memory device can render non-redundant elements of an integrated circuit memory device, such as a memory column, defective. For example, particle contamination during the manufacturing process may cause broken or shorted out columns, bit defects, and/or locked columns.

Redundant elements of an integrated circuit memory device, such as redundant columns, are used to compensate for these random defects. Initial testing of an integrated circuit memory occurs after the manufacturing process. During initial testing of an integrated circuit memory device, defective elements are replaced by non-defective elements referred to as redundant elements. Thus, redundant columns may be used in a scheme to replace defective prime columns, discovered during initial testing of the integrated circuit memory device. The use of redundant elements is important in increasing the overall yield of an integrated circuit memory device.

With ever increasing densities and smaller feature sizes in integrated circuit memory devices, cell redundancy has become more and more important to the proper functioning of larger memory devices. Most memories now require column redundancy in which a portion of the memory cell array is designated as a redundant memory section. When a defective portion of the main memory exist, then the memory cells of the redundant memory section are accessed. On-chip logic circuitry is employed to store defective main memory addresses and to facilitate writing and reading of data to the redundant memory. This logic circuitry includes multiple fuse groups wherein individual fuses within a fuse group are either open or closed to represent a logic state. Each fuse group forms a logic word corresponding to an address of a defective cell or group of cells in the main memory. To enable use of the redundant column a set of fuses are, generally, cut or blown.

FIG. 1a illustrates a previous technique to shift an input-output circuit (IO) to an operational memory column from a faulty memory column. In this previous technique, if a fault exists in an 8, 16, or 32 column-multiplexing memory scheme, then in order to shift an IO to an operational memory column, the fuse corresponding to the faulty memory column is blown and every fuse downstream of that faulty memory column is blown. For example, memory column 3 is illustrated as being a faulty component. Fuse 3 is the fuse associated with memory column 3. Fuse 3 is blown as indicated by storing a logical 1. Additionally, each fuse downstream of the faulty memory column, Fuse 4 through Fuse 7 is also blown. Due to Fuse 3 through Fuse 7 being blown, IO3 through IO7 shift reading and writing operations to an adjacent memory column. However that technique typically causes several problems. One problem is that additional power is required to blow all those fuses. Further, the reliability of blowing fuses decreases as the number of fuses that need to be blown increases. As the number of fuses that need to be blown increases, the statistical probability increases that one of those fuses that is supposed to be blown will in fact not be blown.

SUMMARY OF THE INVENTION

An apparatus and method in which a single fuse is asserted in a memory bank having a redundancy memory column structure. The assertion of the single fuse causes two or more of the input-output circuits to shift away from a primary memory column to a substitute memory column.

Additional features and advantages of the present invention will be apparent from the accompanying drawings and from the detailed description that follows.

BRIEF DESCRIPTION OF THE DRAWINGS

The drawings refer to the invention in which.

DETAILED DISCUSSION

In the following description, numerous specific details are set forth, such as examples of specific data signals, components, connections, etc. in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. The term coupled is defined as meaning connected either directly or indirectly.

In general, the activation of a single fuse may be used to cause column shift circuitry to shift one or more input-output circuits away from a primary memory column to a substitute memory column. The single fuse stores information to indicate a particular memory column contains a faulty cell. The activation of this single fuse causes the input-output circuit correlating to the faulty memory column and all the input-output circuits downstream of the input-output circuit correlating to the faulty memory column to shift away from the faulty memory column and to an operable substitute column.

Figure 1A:
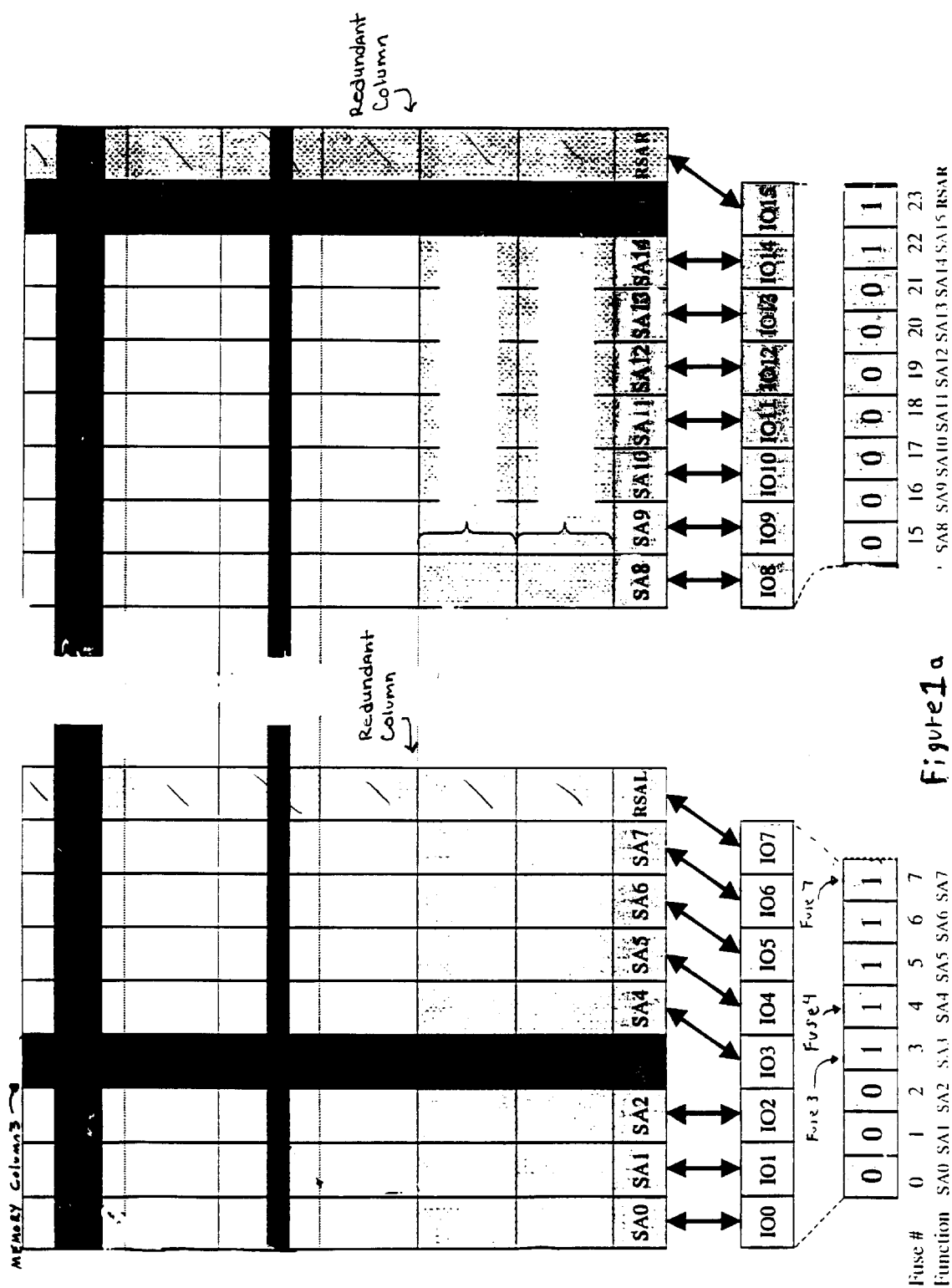
FIG. 1a illustrates a previous technique to shift an input-output circuit (IO) to an operational memory column from a faulty memory column.
Figure 1B:
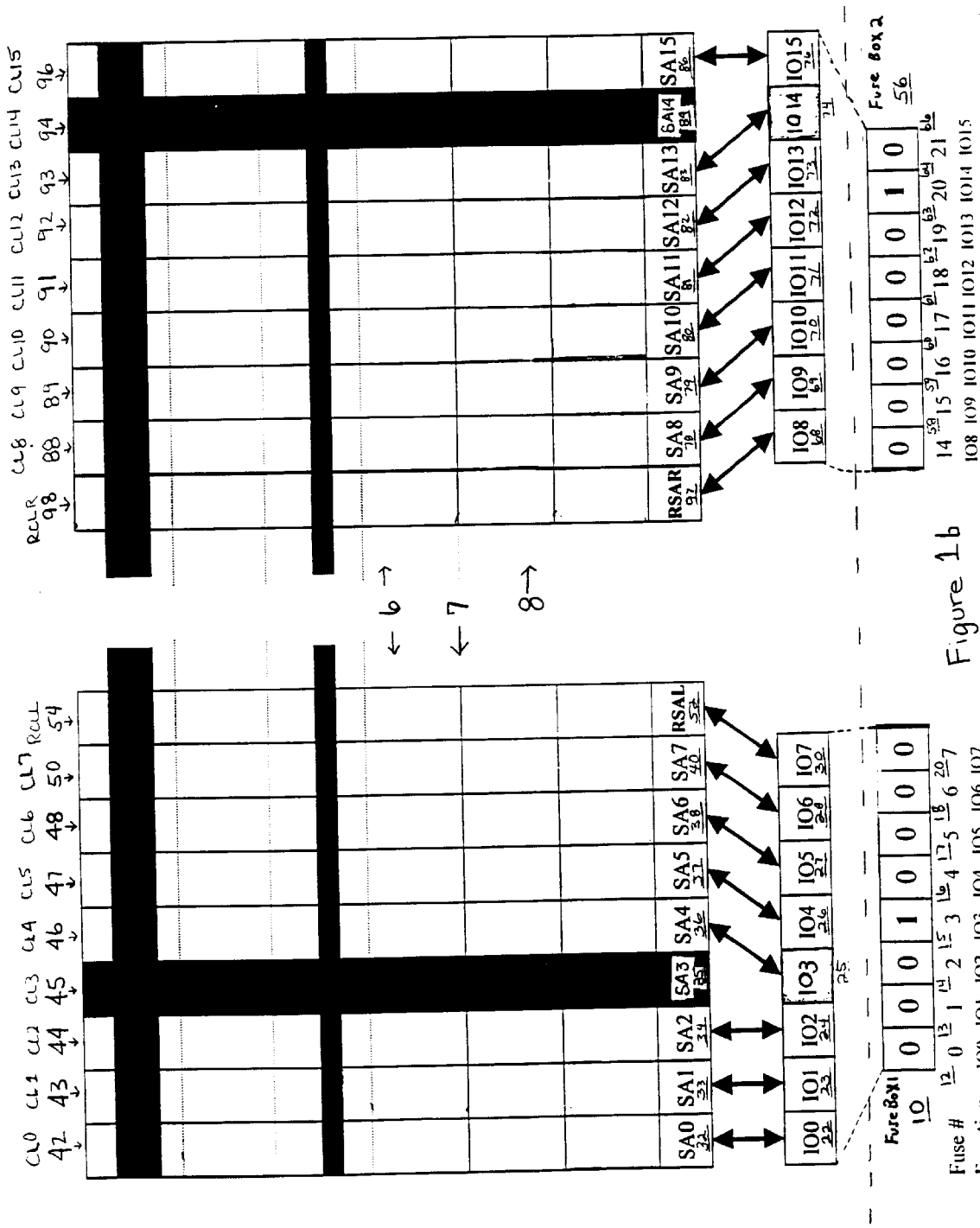
FIG. 1b illustrates a memory having redundant memory cells and fuses for storing faulty cell data.

FIG. 1b illustrates a portion of a memory having redundant memory cells and fuses for storing faulty cell data. Any number of columns may be used, but for purposes of illustration, an integrated circuit memory bank having two blocks of eight memory columns is described. The memory array 6 contains two sides, a left side 7 and a right side 8. The left side 7 contains a "Fuse box 1" 10, which contains eight fuses, "Fuse 0" 12 thru "Fuse 7" 20, eight input-output circuits, "input-output circuit 0" (IO0) 22 thru "input-output circuit 7" (IO7) 30, eight sense amplifiers, "sense amplifier 0" (SA0) 32 thru "sense amplifier 7" (SA7) 40, eight memory columns, "memory column 0" (CL0) 42 thru "memory column 7" (CL7) 50, "redundant sense amplifier left side" (RSAL) 52, and "redundant column left side" (RCLL) 54. The right side 8 of the memory array 6 contains a "Fuse box 2" 56, which contains eight fuses, "Fuse 14" 58 thru "Fuse 21" 66, eight input-output circuits, IO8 68 thru IO15 76, eight sense amplifiers, SA8 78 thru SA15 86, eight memory columns, CL8 88 thru CL15 96, "redundant sense amplifier right side" (RSAR) 97, and "redundant column right side" (RCLR) 98. "Fuse 0" 12 through "Fuse 21" 66 may be laser fuses, ROM, or some other some sort of non-volatile memory storage device.

Each fuse is coupled to provide a bit value to a corresponding IO. For example, "Fuse 0" 12 couples to IO0 22. Each IO connects to a primary memory column through a sense amplifier or a substitute memory column through a sense amplifier. As mentioned, each IO connects to a particular fuse and whether that particular fuse is blown or a fuse downstream from that particular fuse is blown determines whether the IO connects to a primary memory column or a substitute memory column. Downstream may mean a fuse after the faulty memory column, a fuse before the faulty memory column, or something similar to shift the IOs away from the faulty memory column and toward the substitute columns. Note, a blown fuse refers generically to a fuse, which was physically cut, thermally separated, electrically separated, or otherwise changed for the nominal state of the fuse to a second state.

In an embodiment, the "Fuse box 1" 10 and the "Fuse box 2" 56 are located outside the memory array 6. During power up or after blowing the fuses, the contents of the fuses (i.e. fuse data) transfers to shift registers (not shown) located in the input-output circuits. The shift registers couple to the fuses in scan chain manner.

In FIG. 1b, as an example, SA3 35 and/or memory CL3 45 have a fault. "Fuse 3" 25 is in a high logic state, a logical 1, to indicate CL3 is defective. Alternatively, "Fuse 3" 15 could possess a logic low state to activate the column select signal and couple to IO3 25 through an inverter. "Fuse 3" 15 triggers the column shift signal, thus, IO0, IO1, and IO2 read data from and write data to the corresponding primary memory column, CL0, CL1, and CL2. However, since SA3 35 is faulty, then data that would normally be written to or read from SA3 35 from IO3 25 is now shifted to a substitute sense amplifier and memory column. SA3 35, being faulty causes IO3 25 to now read and write data to CL4 46 through SA4 36. Correspondingly, IO4 26 through IO7 30, the downstream IOs also shift to reading and writing data to a substitute memory column. Thus, IO4 26 reads and writes data through SA5 37. IO5 27 reads and writes data through SA6 38. IO6 28 reads and writes data through SA7 40. Finally, IO7 30 reads and writes data through the redundant sense amplifier left side 52. The column shift signal initiated by "Fuse 3" 15 blowing has caused IO3 25 through IO7 30 to shift to a substitute memory column without having to blow the fuses corresponding to IO4 26 through IO7 30.

FIG. 1b shows, as a further example, a fault located on the right side 8 of the memory array 6 in CL14 93. The fuse which connects to IO14 74, "Fuse 20" 64 is blown, i.e. a logical 1, to indicate CL14 94 is defective. "Fuse 20" 64 triggers the column shift signal. Thus, the upstream IO, IO15 76, still reads data from and writes data to the corresponding CL15 96. However, since CL14 94 is faulty, then data that would normally be written to or read from CL14 94 from IO14 74 is now shifted to a substitute sense amplifier and memory column. CL14 94 being faulty causes IO14 74 to now read and write data to CL13 94 through SA13 83. Correspondingly, IO14 74 through IO8 68, the downstream IOs also shift to reading and writing data to a substitute memory column. Thus, IO14 74 reads and writes data through SA13 83. The remaining IOs read and write data through a shifted memory column until, finally, IO8 68 reads and writes data through the redundant sense amplifier right side 97. The column shift signal initiated by "Fuse 20" 64 blowing caused IO14 74 through IO8 68 to shift to a substitute memory column without having to blow the fuses corresponding to IO13 73 through IO8 68.

Figure 2:
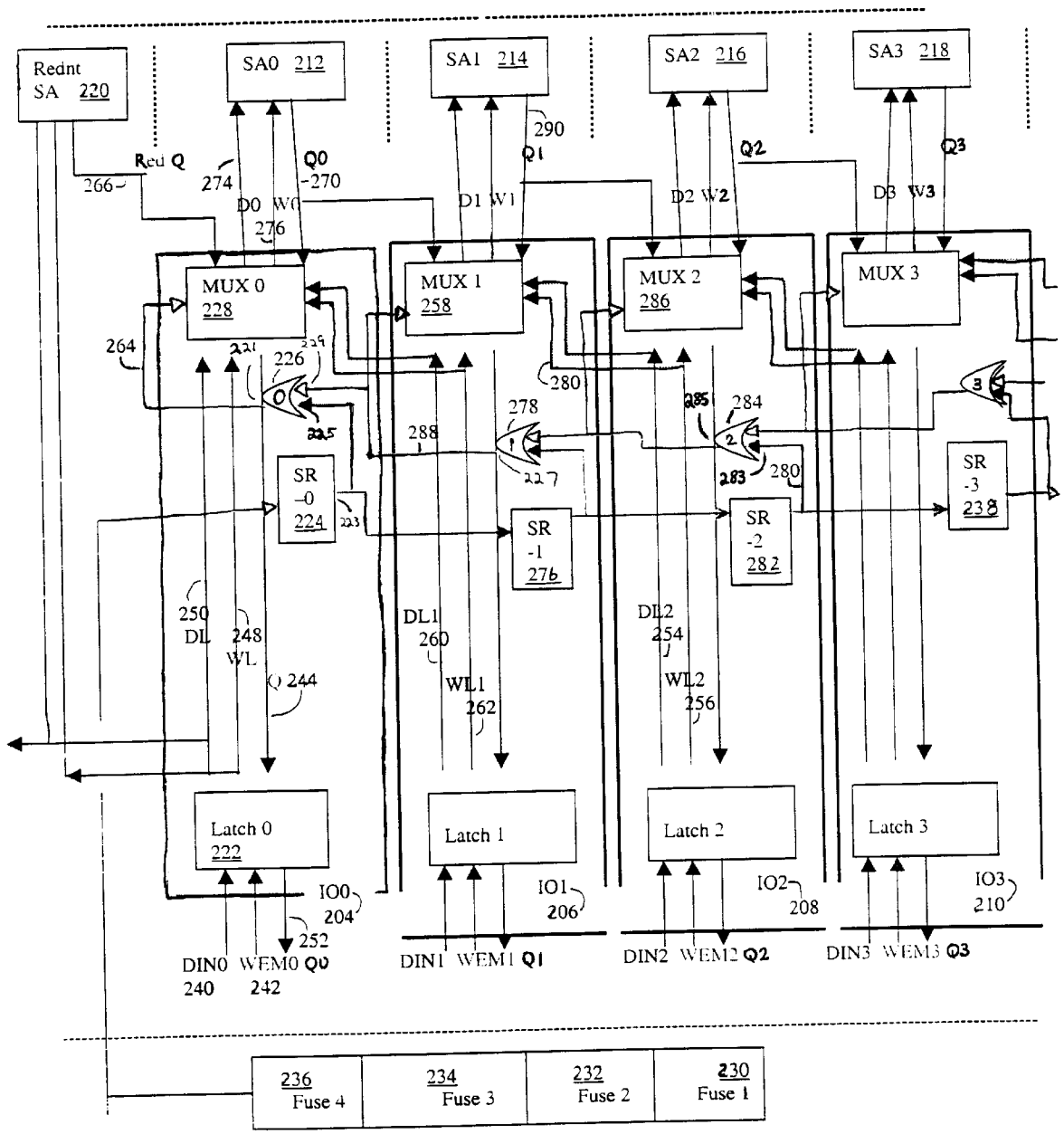
FIG. 2 illustrates an embodiment of a column redundancy scheme in an eight column-multiplexing configuration for blowing a single fuse per defective column.

FIG. 2 illustrates an embodiment of a column redundancy scheme in an eight column-multiplexing configuration to blow a single fuse per defective column. FIG. 2 illustrates four IOs and five sense amplifiers contained within the eight column-multiplexing configuration. FIG. 2 contains a "Fuse box 1" 202, input-output circuits-IO0 204, IO1 206, IO2 208, IO3 210, sense amplifiers—SA0 212, SA1 214, SA2 216, SA3 218, and the redundant sense amplifier 220, each sense amplifier connects to a corresponding memory column (not shown). An embodiment of the IO circuitry has the following components: a latch, a shift register (SR), an OR logic gate, and a multiplexing circuit (MUX). For example, IO0 204 contains "latch 0" 222, "shift register 0" (SR0) 224, "OR logic gate 0" 226, and "multiplexing circuit 0" (MUX0) 228. IO1 206 through IO3 210 contain similar components. "Fuse box 1" 202 contains, "Fuse 1" 230, "Fuse 2" 232, "Fuse 3" 234, and "Fuse 4" 236. In an embodiment, the information contained in "Fuse 1" 230 thru "Fuse 4" 236 is serially transferred into SR0 224 thru SR3 238.

In an embodiment, the operation of each IO may be similar so IO0 204 will be used as an example. Where a difference occurs in the operation of a particular IO, then the differences will be noted. "Latch 0" 222 has three inputs, "data input 0" signal 240, "write enable input 0" signal 242, and "data output 0" signal 244. "Latch 0" 222 has three outputs. The three outputs are "data latch 0" signal 250, "write enable latch 0" signal 248, and "bus data out" signal 252. Two of these output signals go to the input of MUX0 228 and a substitute path. The "data latch 0" signal 250 and "write enable latch 0" signal 248 are coupled to the input of the redundant sense amp 220 for the substitute path in the case of IO0 204. In the case of the remaining IOs, the substitute path for the data latch and write enable latch signals is a downstream MUX in the adjacent IO.

For example, the substitute path for "data latch 2" signal 254 and "write enable latch 2" signal 256 is to MUX1 258. MUX0 228 has seven inputs and three outputs. The seven inputs are "data latch 0" signal 250 and "write enable latch 0" signal 248, "data latch 1" signal 260 and "write enable latch 1" signal 262, column shift signal 264 from "OR logic gate 0" 226, "data out 0" signal 266 from the redundant sense amplifier 220, and "data out 0" signal 270 from the sense amplifier 212. The three outputs from MUX0 228 are "data in 0" signal 274 to SA0 212, "write enable in 0" signal 276 to SA0 212, and "data output 0" signal 244 to "latch 0" 222. The remaining MUXs in the remaining IOs are similar except instead of transferring signals to and from the redundant sense amplifier 220, the MUXs transfer signals to and from the adjacent downstream sense amplifier. SA0 212 has the two inputs, "data in 0" signal 274 and "write enable in 0" signal 276, from MUX0 228. SA0 212 has one output that is coupled to both MUX0 228 and the downstream MUX, MUX1 258.

In an embodiment, when no fault is present and the memory is in write mode, MUX0 228 passes the "data latch 0" signal 250 and the "write enable latch 0" signal 248 to SA0 212. SA0 212 communicates the data into the memory column 0 (not shown). In read mode, memory column 0 through SA0 212 communicates data from memory column 0 through the "data output 0" signal 270 to MUX0 228. The "data out 0" signal 270 travels through MUX0 228 and to "latch 0" 222. After MUX0 228, "data out 0" signal 270 becomes "data output 0" signal 244. "Latch 0" 222 couples the "data output 0" signal 244 to the bus. In write mode, MUX0 228 passes data coming through "latch 0" 222 to SA0 212.

In an embodiment, the column shift circuitry is constructed in the following manner. Each fuse from "Fuse box 1" 202 is scan chain connected to a corresponding shift register located in each IO. Each shift register connects in series with a shift register in an adjacent IO. For example, the output of SR0 224 couples with the input of SR1 276. The output of each shift register also couples to the input of each corresponding OR logic gate. For example, the output 223 of SR0 224 couples to the input 225 of "OR logic gate 0" 226. Each output of an OR logic gate connects in series with the input of an OR logic gate in an adjacent IO. However, the flow of the signal traveling through the OR logic gates is in an opposite direction of that for the shift registers. For example, the output 227 of "OR logic gate 1" 278 couples to the input 229 of "OR logic gate 0" 226.

In an embodiment, if a fault occurs in either SA2 216 or memory column 2 (not shown) then the following happens. "Fuse 2" 232 changes states to store a logical 1. The change of state of "Fuse 2" 232 triggers the column shift signal 280 and causes the following events. The fault indication in "Fuse 2" 232 is transferred to SR2 282. SR2 282 couples the column shift signal 280, a logical 1 in this case, to the input 283 of "OR logic gate 2" 284. Upon receiving a logical 1 on the input 283 of the "OR logic gate 2" 284, the output 285 of the "OR logic gate 2" 284 changes to a logical 1. The logical 1 is communicated and ripples through each OR logic gate serially down the line. In this case, "OR logic gate 0" 226, "OR logic gate 1" 278, and "OR logic gate 2" 284 generate a logical 1 at each of their respective outputs 227, 283, and 221. The presence of the column shift signal at the input of each MUX causes each corresponding MUX to not accept data or a write enable signal from its corresponding latch and sense amplifier but rather to accept the data latch and write enable signals from the downstream latch and the data out signal from the downstream sense amplifier.

In this example, "Fuse 2" 232 is blown, and MUX0 228, MUX1 258, and MUX2 286 sense the corresponding column shift signal 264, 280, 288 at their input. MUX0 228 blocks the "data latch 0" signal 250 and the "write enable latch 0" signal 248. MUX0 228 accepts the "data latch 1" signal 260 and the "write enable 1" signal 262. MUX0 228 blocks the "data out 0" signal 270 from SA0 212 and accepts the "data out" signal 266 from the redundant sense amplifier 220. The redundant sense amplifier 220 accepts the "data latch 0" signal 250 and the "write enable latch 0" signal 248. MUX1 258 blocks the "data latch 1" signal 260 and the "write enable 1" signal 262. MUX1 258 accepts the "data latch 2" signal 254 and the "write enable latch 2" signal 256. MUX1 258 blocks the "data out 1" signal 290 from SA1 214 and accepts the "data out 0" signal 270 from the SA0 212. MUX2 286 shifts in a similar manner as MUX0 228 and MUX1 258. The data being written to a memory column and being read from a memory column is shifted one column away from the faulty column, memory column 2 in this case, and towards the substitute column. The substitute column for MUX2 286 is memory column 1 (not shown).

In an embodiment, one of the two inputs belonging to the OR logic gate beginning the series ripple logic is tied to a logical 0. In the case of an eight column multiplexing circuit scheme, OR logic gate 7 (not shown) would begin the OR logic part of the series ripple logic and have one input tied to a logical 0. In an embodiment, a shift register may be a flip-flop. One skilled in the art will understand that multiple embodiments of the column shift circuitry may be constructed from logic circuitry, such as AND gates, NAND gates, Exclusive OR gates, Inverters, etc., to accomplish the ripple logic concept. The ripple logic concept allows a single blown fuse to shift an affected IO and all IOs downstream of the affected IO to shift away from the faulty memory column to a substitute memory column.

Figure 3:
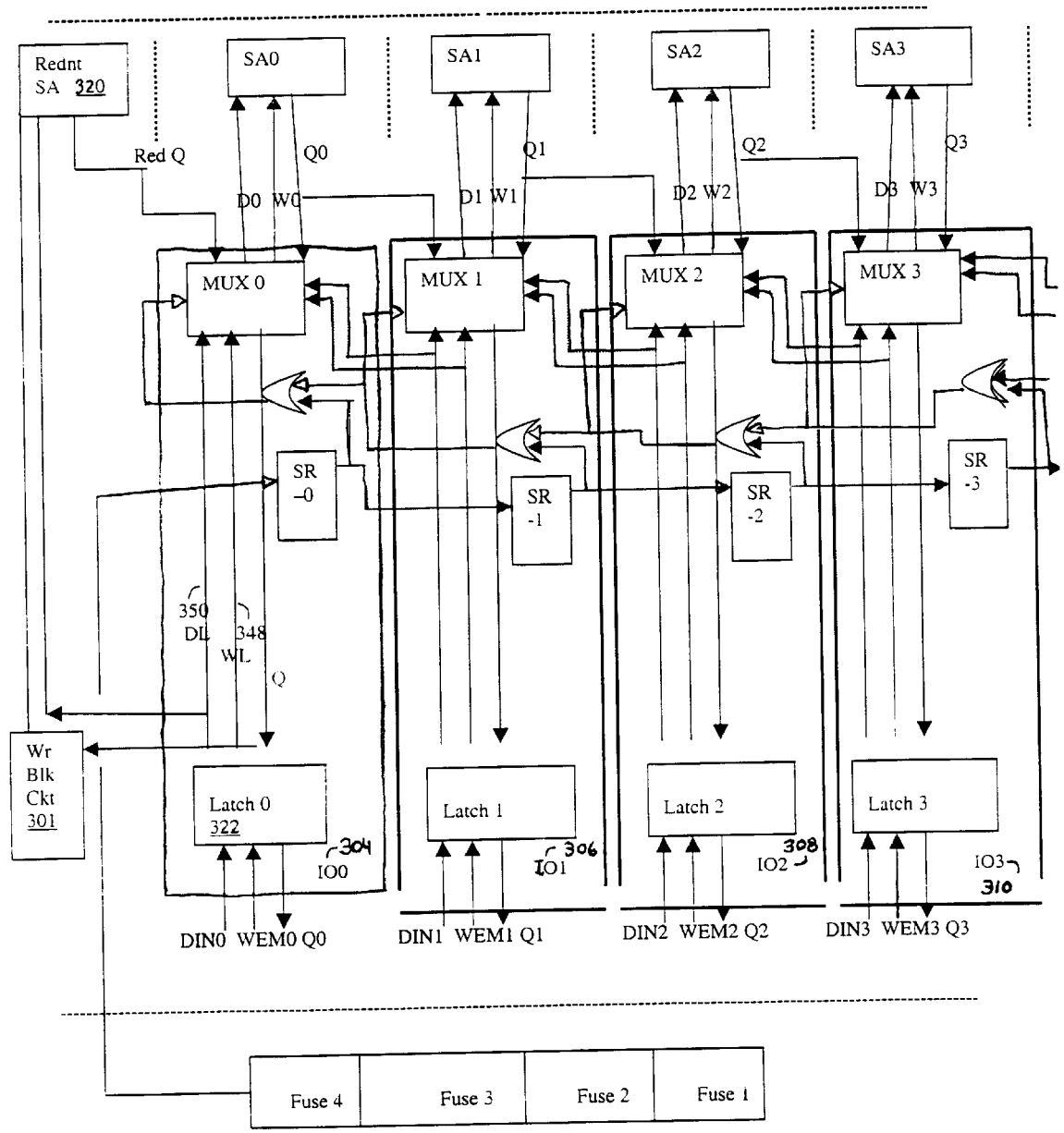
FIG. 3 illustrates an embodiment of a column redundancy scheme in a sixteen column-multiplexing or thirty two column-multiplexing configuration for blowing a single fuse per defective column.

FIG. 3 illustrates an embodiment of a column redundancy scheme in a sixteen column-multiplexing or thirty two column-multiplexing configuration for blowing a single fuse per defective column. In an embodiment, the operation and construction of the sixteen column-multiplexing scheme is very similar to that of the eight column-multiplexing scheme except for the following distinctions. The "data latch 0" signal 350 still goes directly to the redundant sense amplifier 320; however, the "write enable latch 0" signal 348 out of "latch 0" 322 couples to a write block circuit 301. The output of the write block circuit 301 couples to the redundant sense amplifier 320. The write block circuit 301 consists of groups of comparators to ensure that the proper IO column is reading and writing to the redundant sense amplifier 320 and memory column (not shown). In an embodiment of the sixteen column-multiplexing configuration, sub IOs exist. Thus, IO1 306 and IO0 304 would be combined as sub IOs to form a single IO. The single IO having one shift register, a single fuse to indicate that the memory column associated with the single IO contains a faulty cell, and one fuse to indicate whether the faulty memory column correlates to sub IO0 or sub IO1 (not shown). Similarly, in a thirty-two column-multiplexing configuration, IO0 304, IO1 306, IO2 308, and IO4 310 would be combined as sub IOs to form a single IO. The single IO having one shift register, a single fuse to indicate that the memory column associated with the single IO contains a faulty cell, and two additional fuses to indicate whether the faulty memory column correlates to sub IO0, sub IO1, sub IO2, or sub IO3 (not shown).

Figure 4:
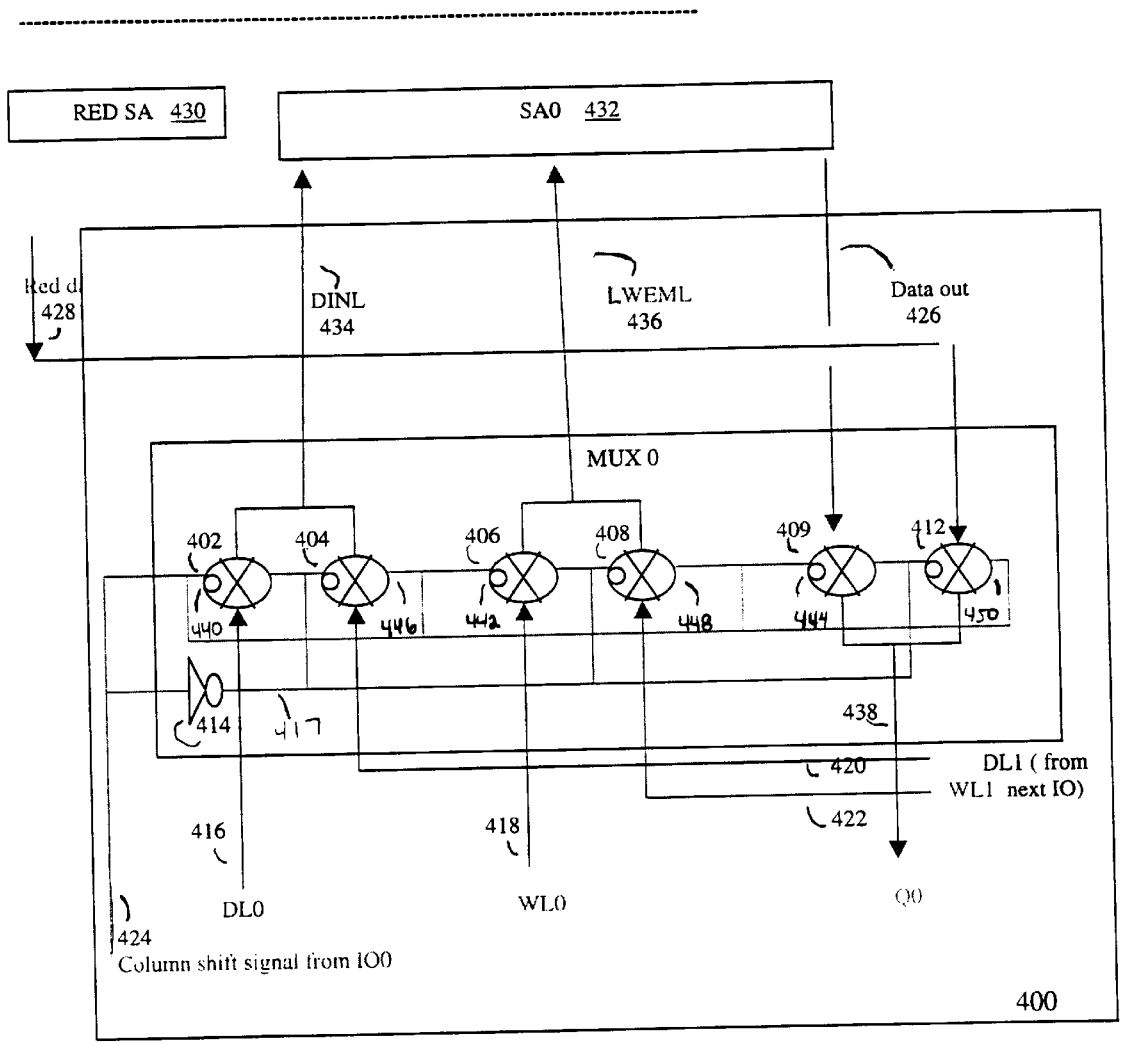
FIG. 4 illustrates an embodiment of a multiplexing circuit.

FIG. 4 illustrates an embodiment of a multiplexing circuit. The multiplexing circuit 400 contains three sets of complimentary transmission gates, "transmission gate 1" 402 thru "transmission gate 6" 412, and an inverter 414. In an embodiment, the multiplexing circuit 400 has seven inputs and three outputs. The seven inputs are "data latch 0" signal 416 and "write enable latch 0" signal 418, "data latch 1" signal 420 and "write enable latch 1" signal 422 column shift signal 424 from OR logic gate 0 (not shown), data out redundant signal 428 from the redundant sense amplifier 430, and "data out 0" signal 426 from the SA0 432. The three outputs from multiplexing circuit 400 are "data in 0" signal 434 to SA0 432, "write enable in 0" signal 436 to SA0 432, and "data output 0" signal 438 to latch 0 (not shown).

The complimentary transmission gates operate in the following manner. Two transmission gates have their control signal inputs and data outputs tied together such that one of the transmission gates is always forward biased (ON) and one of the transmission gates is always reversed biased (OFF). The forward bias transmission gate passes data through its gate. The reverse bias transmission gate blocks data passing through its gate. In an embodiment, the source input of one of the transmission gates is tied to the drain input of the second transmission gate and vice versa The column shift signal 424 is a first control signal input to all six transmission gates 402–412. The inverse of the column shift signal 417 from the inverter 414 is the second control signal input to all six transmission gates 402–412. In an embodiment, a first set of transmission gates 402 and 404 pass either "data latch 1" signal 420 or "data latch 0" signal 416 to SA0 432. A second set of transmission gates 406 and 408 pass either "write enable latch 1" signal 422 or "write enable latch 0" signal 418 to SA0 432. A third set of transmission gates 409 and 412 pass either "data out 0" signal 426 to "latch 0" from SA0 432 or data out redundant signal 428 to "latch 0" from the redundant sense amplifier 430.

The transmission gates receive an input from the column shift signal from the logical OR logic gates in each particular IO. The inverter also receives the column shift signal from the logical OR logic gates in each particular IO. Thus, in an embodiment, if the column shift signal 424 has been triggered then a logical 1 is sensed on the source input 440 of "transmission gate 2" 404, the source input 442 of "transmission gate 4" 408, and the source input 444 of "transmission gate 6" 412, as well as the drain input 446 of "transmission gate 1" 402, the drain input 448 of "transmission gate 3" 406, and the drain input 450 of "transmission gate 5" 409. Thus, the signals from the downstream IO, "data latch 1" signal 420, "write enable latch 1" signal, and data out redundant signal 428 pass through the transmission gates 402–412 and the signals from the primary IO are blocked.

Figure 5:
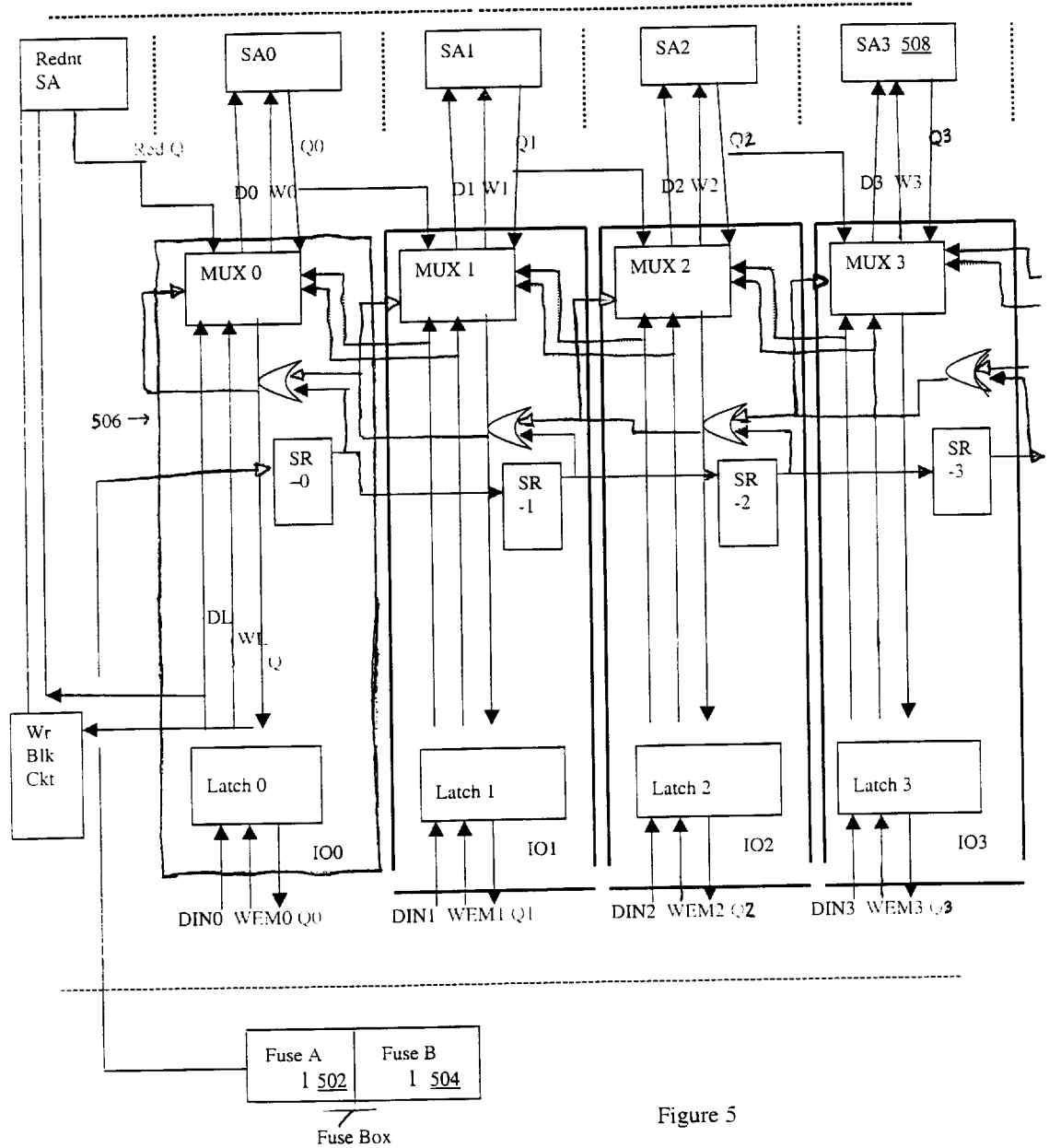
FIG. 5 illustrates an embodiment of multiple fuses arranged as a binary number equivalent to be substituted for a single fuse indicating the location of a faulty memory cell.

FIG. 5 illustrates an embodiment of multiple fuses arranged as a binary number equivalent to be substituted for a single fuse indicating the location of a faulty memory cell. In an alternative embodiment, the single fuse which stores information regarding the location of the faulty cell is split into two or more fuses which are used to store information regarding the location of the faulty cell. The two or more fuses when read from the most significant bit to the least significant bit correspond to a binary number equivalent. For example, instead of a single fuse (as discussed in FIG. 2), "Fuse 1" 230, activating to indicate a fault in either SA3 218 or memory column 3, two fuses, "Fuse A" 502 and "Fuse B" 504, may be blown to indicate a binary "11" or a binary "3" equivalent. The binary number equivalent communicated to the column shift circuitry 506 by "Fuse A" 502 and "Fuse B" 504 indicates that the location of the faulty memory column is memory column 3 (not shown). Note, memory column 3 is designated as the faulty memory column irrespective of whether the fault actually exists in SA3 508 or memory column 3.

Figure 6:
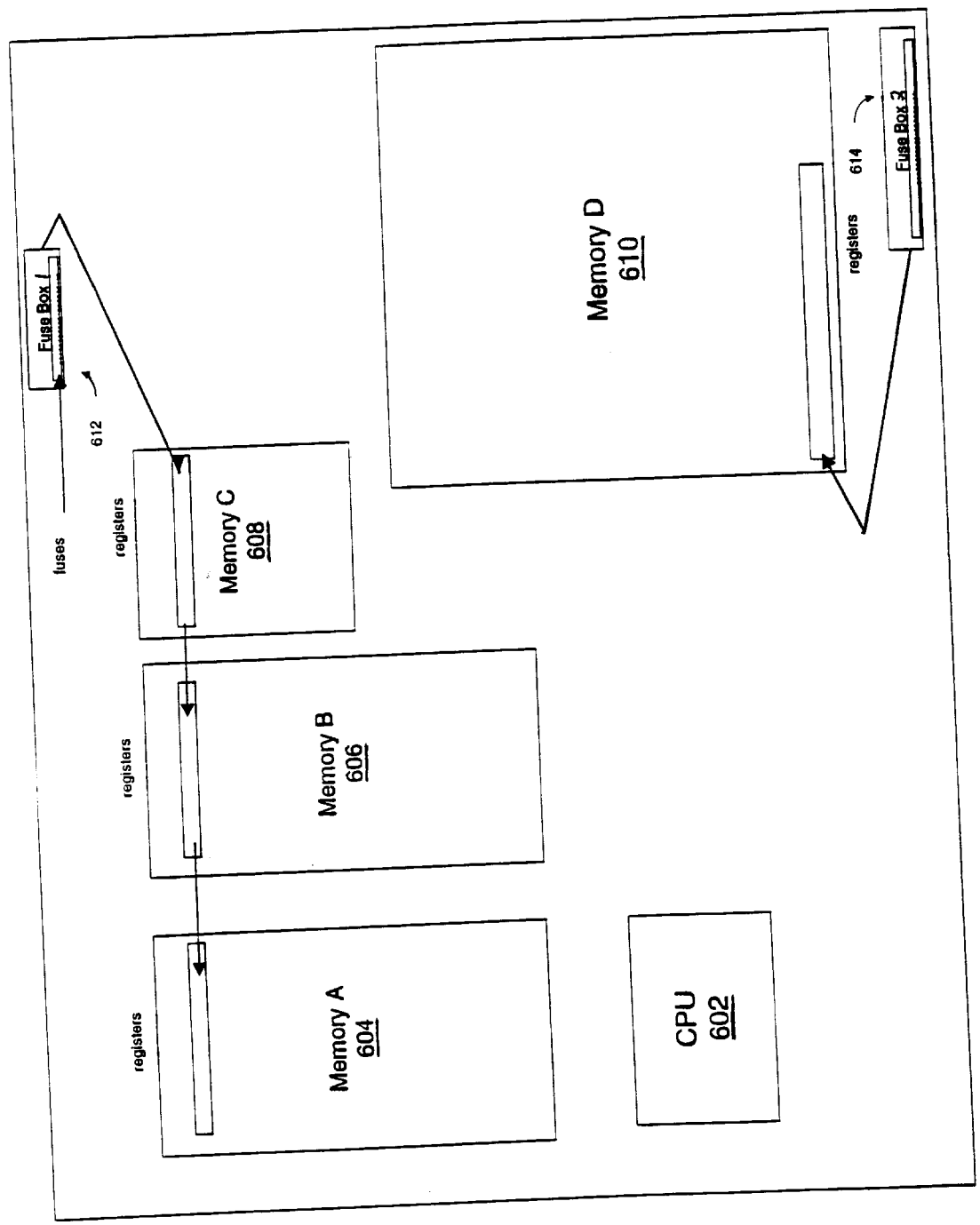
FIG. 6 illustrates a processor system containing multiple memory instances having column shift circuitry to shift a plurality of the input-output circuits away from a primary memory column to a substitute memory column upon the assertion of a single fuse.

FIG. 6 illustrates a processor system containing multiple memory instances having column shift circuitry to shift a plurality of the input-output circuits away from a primary memory column to a substitute memory column upon the assertion of a single fuse. The processor system has a central processing unit 602, four memory arrays, "memory A" 604, "memory B" 606, "memory C" 608, and "memory D" 610, as well as two fuse boxes, "Fuse box 1" 612 and "Fuse box 2" 614. The memory arrays 604–610 have a memory column redundancy structure. "Fuse box 1" 612 and "Fuse box 2" 614 contain fuses. The fuses store address information corresponding to a particular memory column containing a faulty cell. The memory arrays 604–610 also contain column shift circuity to shift a plurality of the input-output circuits away from a primary memory column to a substitute memory column upon assertion of a single fuse. The CPU 602 reads and writes data to the memory in the memory arrays 604–610 through the input output circuits contained in each memory array.

Which some specific embodiments of the invention have been shown the invention is not to be limited to these embodiments. For example, most functions performed by electronic hardware components may be duplicated by software emulation. Thus, the functionality of the hardware components in the column shift circuitry may be emulated by a software program written to accomplish those same functions. The invention is to be understood as not limited by the specific embodiments described herein, but only by scope of the appended claims.

We claim:

1. An apparatus, comprising:
    a memory array having a memory column redundancy structure;
    a plurality of input-output circuits; and
    a column shift circuitry to shift two or more of the input-output circuits away from a primary memory column to a substitute memory column upon assertion of a signal from a single fuse, the single fuse coupled to the column shift circuitry.

2. The apparatus of claim 1, wherein the column shift circuitry comprises a logic circuit and a multiplexing circuit.

3. The apparatus of claim 2, wherein the logic circuitry comprises:
    a plurality of shift registers connected in series such that a signal path lays in a first direction through each adjacent input-output circuit; and
    a plurality of OR logic gates connected in series such that the signal path lays in an opposite direction of the signal path through the plurality of shift registers.

4. The apparatus of claim 1, wherein the memory array comprises an eight column-multiplexing structure.

5. The apparatus of claim 1, wherein the memory array comprises a sixteen column-multiplexing structure.

6. The apparatus of claim 1, wherein the memory array comprises a thirty-two column-multiplexing structure.

7. The apparatus of claim 1, wherein the single fuse comprises a non-volatile storage device, the single fuse to store address information corresponding to a particular memory column containing a faulty cell.

8. The apparatus of claim 1, wherein assertion comprises changing the logic state.

9. The apparatus of claim 1, wherein the multiplexing circuit comprises:
    a plurality of complimentary transmission gates; and
    an inverter, the inverter coupled to a shared input of the complimentary transmission gates.

10. The apparatus of claim 1, wherein the single fuse comprises one fuse in a plurality of fuses coupled to the column shift circuitry.

11. A processor system, comprising:
    a central processing unit;
    a memory device having a memory column redundancy structure; and
    a column shift circuitry to shift a plurality of input-outputs circuits away from a primary memory column to a substitute memory column upon assertion of a single fuse.

12. The apparatus of claim 11, wherein the column shift circuitry comprises a logic circuit and a multiplexing circuit.

13. The apparatus of claim 11, wherein assertion comprises blowing the single fuse.

14. The apparatus of claim 11, wherein assertion comprises cutting the single fuse.

15. The apparatus of claim 11, wherein assertion comprises changing a logic state of information stored within the single fuse.

16. A method, comprising:
    asserting a single fuse associated with a memory having a redundancy memory column structure; and
    shifting operations of a plurality of input-output circuits from a primary memory column to a substitute memory column upon the assertion of the single fuse.

17. The method of claim 16, wherein asserting comprises changing a logic state of information stored within the single fuse.

18. The method of claim 16, wherein the operations comprise reading data from the primary memory and writing data to the primary memory.

19. An apparatus, comprising:
    means for asserting a single fuse in a memory having a redundancy memory column structure; and
    means for shifting operations of a plurality of input-output circuits from a primary memory column to a substitute memory column upon the assertion of the single fuse.

20. The apparatus of claim 19, wherein asserting comprises changing a logic state of information stored within the single fuse.

21. The apparatus of claim 19, wherein the plurality of input-output circuits shifted comprise an input-output circuit corresponding to a faulty memory column and the input-output circuits downstream of the input-output circuit corresponding to the faulty memory column.

22. The apparatus of claim 19, wherein the single fuse comprises one fuse.

23. The apparatus of claim 19, wherein the single fuse comprises multiple fuses arranged as a binary number equivalent.

24. An apparatus, comprising:
    an array of memory cells arranged in columns; the array of memory cells having a column redundancy structure, the column redundancy structure having a primary column and a substitute column;
    a plurality of non-volatile storage devices to store data regarding a fault state of a particular column;
    a plurality of input-output circuits; and
    column shift circuitry to trigger a particular input-output circuit and any input-output circuits downstream of the particular input-output circuit to shift an operation from a corresponding primary memory column to a corresponding substitute memory column upon a change of state of one of the non-volatile storage devices.

25. The apparatus of claim 24, wherein the operation comprises reading data from the corresponding primary memory.

26. The apparatus of claim 24, wherein the operation comprises writing data to the corresponding primary memory.

27. The apparatus of claim 24, wherein input-output circuits downstream of the particular input-output circuit comprise memory columns sequentially after a faulty memory column.

28. The apparatus of claim 24, wherein input-output circuits downstream of the particular input-output circuit comprise memory columns sequentially before the faulty memory column.

29. The method of claim 16, wherein the single fuse associated with the memory comprises the single fuse coupled to the memory.

30. The method of claim 16, wherein the single fuse associated with the memory comprises the single fuse electrically connected to the memory.

* * * * *